United States Patent
Kuijk et al.

(10) Patent No.: US 6,987,268 B2
(45) Date of Patent: Jan. 17, 2006

(54) DETECTOR FOR ELECTROMAGNETIC RADIATION ASSISTED BY MAJORITY CURRENT

(75) Inventors: Maarten Kuijk, Berchem-Antwerpen (BE); Daniel Van Nieuwenhove, Hofstade (BE)

(73) Assignee: Vrije Universiteit Brussel, Brussels (BE)

( * ) Notice: Subject to any disclaimer, the term of this patent is extended or adjusted under 35 U.S.C. 154(b) by 0 days.

(21) Appl. No.: 10/929,277

(22) Filed: Aug. 30, 2004

(65) Prior Publication Data

US 2005/0051730 A1 Mar. 10, 2005

(30) Foreign Application Priority Data

Sep. 2, 2003 (EP) .................................. 03077744

(51) Int. Cl.
*G01T 1/24* (2006.01)
(52) U.S. Cl. ................................. 250/370.01
(58) Field of Classification Search ............. 250/336.1, 250/338.4, 370.01
See application file for complete search history.

(56) References Cited

U.S. PATENT DOCUMENTS

| 4,074,302 A | * | 2/1978 | Brewer ....................... 257/216 |
| 6,157,035 A | | 12/2000 | Kuijk |
| 6,515,903 B1 | * | 2/2003 | Le et al. ................. 365/185.18 |

2002/0140045 A1  10/2002 Lauter et al.

FOREIGN PATENT DOCUMENTS

| EP | 0883187 A | 12/1998 |
| WO | WO-98/10255 A1 | 3/1998 |
| WO | WO-99/60629 A1 | 11/1999 |
| WO | WO 02/33817 A | 4/2002 |

* cited by examiner

Primary Examiner—David Porta
Assistant Examiner—Marcus Taningco
(74) Attorney, Agent, or Firm—Barnes & Thornburg

(57) ABSTRACT

The present invention relates to a novel photo-detector structure and method whereby light is detected in a semiconductor substrate. Through the use of a small current of majority carriers an electrical field is created that directs photo-generated minority carriers towards a detection region. In this way, a large sensitive area 34 for a detector can be designed with a detection region having low junction area and low associated detector capacitance, thus enhancing output signal to noise ratio and/or speed of attached readout circuits. Simultaneously, the assistant majority current can sweep the minority carriers from deep within the substrate towards the detection region, thus improving the overall detector sensitivity. By making the majority current reconfigurable, a photonic mixer structure with two or more detection regions can be conceived, whereby the direction of the applied current will determine in an efficient way to which detection region the photo-generated minority carriers will be directed. In this way, incident modulated light can get demodulated, such that phase and amplitude of the modulated light can be measured for a.o. range-finding applications.

18 Claims, 6 Drawing Sheets

DETECTOR FOR ELECTROMAGNETIC RADIATION ASSISTED BY MAJORITY CURRENT

FIELD OF THE INVENTION

The present invention relates to the field of detection of electromagnetic radiation that generates minority carriers in a semi-conductor substrate, such as for example, but not limited to, detection of visible and infrared light. More particularly, the present invention relates to electromagnetic radiation detection in a substrate and more specifically on the application of a majority current for directing photo-generated minority charges towards a detection region as well as an apparatus therefor.

TECHNICAL BACKGROUND OF THE INVENTION

U.S. Pat. No. 6,157,035 describes how a fast detector in a standard CMOS technology can be constructed. A shadow mask gives a spatial modulation to the incident, and consequently of the absorbed light in the semiconductor substrate. By measuring the magnitude of the spatial frequency component in the minority carrier distribution with a spatial frequency corresponding to that of the shadow mask, a fast detector is provided. Speed is hereby enhanced but the traded-off is sensitivity.

WO 98/10255 and WO 99/60629 show methods and corresponding devices for determining the phase and/or amplitude of incident modulated light. These pixel structures are called photonic mixers. These structures are useful for making range-finding cameras giving depth or 3D information as is explained in these patent applications. By applying a modulation voltage over two photo-gates, the generated minority carriers in the substrate arrive preferentially at one of two detector accumulation zones. In WO 98/10255, these accumulation zones are potential wells, created by a voltage on an adjacent accumulation gate. In WO 99/60629, these accumulation zones are pn-junctions. There are however two major deficiencies with these photonic mixers. Firstly, for light that is absorbed more deeply in the substrate, the generated minority carriers will have to diffuse towards the surface before the modulation photogates can redirect these carriers towards the destination accumulation zones. This diffusion process over a 5 to 20 $\mu$m distance limits the speed with which demodulation can be achieved. Second, the percentage of detected minority carriers that reach effectively the target accumulation zone is far from optimal.

SUMMARY OF THE INVENTION

The present invention aims to provide a novel photo-detector structure that has a detection region, e.g. a diode junction such as a pn-junction (semiconductor-semiconductor) detection area or a Schottky junction (metal-semiconductor) detection area that can be of an order of magnitude smaller in area than the effective light sensitive area thereby lowering considerably the capacitance of the detection region, e.g. detecting diode-junction. Further, it is also an aim of the invention to provide a method of collecting photo-generated carriers that are present deeply in the substrate, in a fast way, in order to obtain a fast and sensitive detector.

Another aim of the invention is to provide a photonic mixer structure and method that has two or more detector outputs, and whereby the photo-generated minority carriers get collected at a target detector output. An aim hereby is to reach this in a very efficient way, with high discrimination- and quantum efficiency. High detection bandwidth and high speed of switching between specified detector outputs are aimed for as well.

The above objectives are accomplished by a method and device according to the present invention.

In one aspect, the present invention provides a detector device for detection of electromagnetic radiation impinging on a substrate, the impinging electromagnetic radiation generating pairs of majority and minority carriers in the substrate. The detector device comprises means for generating, in the substrate, a majority carrier current, and at least one detection region for collecting generated minority carriers, the minority carriers being directed towards the at least one detection region under influence of the majority carrier current. The detection region may be a diode junction, for example a detection pn-junction or a Schottky (metal to semiconductor) junction.

The detector device may furthermore comprise at least one current source region and at least one current drain region, the means for generating the majority carrier current being adapted for generating this majority carrier current between the at least one current source region and the at least one current drain region. The at least one current source region may be located between the at least one current drain region and the at least one detection region, e.g. diode junction. Alternatively, the at least one detection region, e.g. diode junction, may be located between the at least one current source region and the at least one current drain region. The current source region, the current drain region and the detection region may be located substantially in the same plane. With "substantially in the same plane" is meant that they for example have a top surface in the same plane, as a plane is two-dimensional and per definition has no thickness, while the current source region, the current drain region and the detection region are three-dimensional structures. The current source region, current drain region and detection region may be located at the surface of the substrate of the detector device.

The current source region may have an annular shape in the plane of the substrate. Also the current drain region may have an annular shape in the plane of the substrate.

A detector device according to the present invention may furthermore comprise readout means for reading out the minority carriers collected in the detection region, e.g. a diode junction such as a pn-junction or a Schottky junction. The readout means may comprise a transimpedance amplifier.

In a detector device according to the present invention, minority carriers having reached the at least one current source region may travel towards the at least one detection region by diffusion.

The sensitive area of a detector according to the present invention may be substantially larger then the area of the at least one detection region.

A detector device according to the present invention may be a photonic mixer. The means for generating the majority carrier current may be reconfigurable, so as to be able to generate the majority carrier current in either at least a first direction or a second direction different from the first direction. The second direction may be opposite to the first direction.

In a second aspect, the present invention provides the use of a detector according to the present invention in a time of flight range-finding application.

In a third aspect, the present invention provides a method for detection of electromagnetic radiation impinging on a substrate, the impinging electromagnetic radiation generating pairs of majority and minority carriers in the substrate. The method comprises generating a majority carrier current in the substrate, and directing generated minority carriers towards a detection region such as a diode junction, e.g. a pn-junction or a Schottky junction, under influence of the generated majority carrier current.

The method may furthermore comprise collecting the minority carriers in the detection region, and reading out the minority carriers collected in the detection region.

A method according to the present invention may furthermore comprise generating the majority carrier current so as to at least first generate the majority carrier current in a first direction and to direct generated minority carriers towards a first detection region, e.g. a diode junction such as a pn-junction or a Schottky junction, and thereafter generate the majority carrier current in a second direction, the second direction being different with respect to the first direction, to thereby direct generated minority carriers towards a second detection region, e.g. a diode junction such as a pn-junction or a Schottky junction. The second direction may be opposite the first direction.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

SHORT DESCRIPTION OF THE DRAWINGS

Figure 1A:
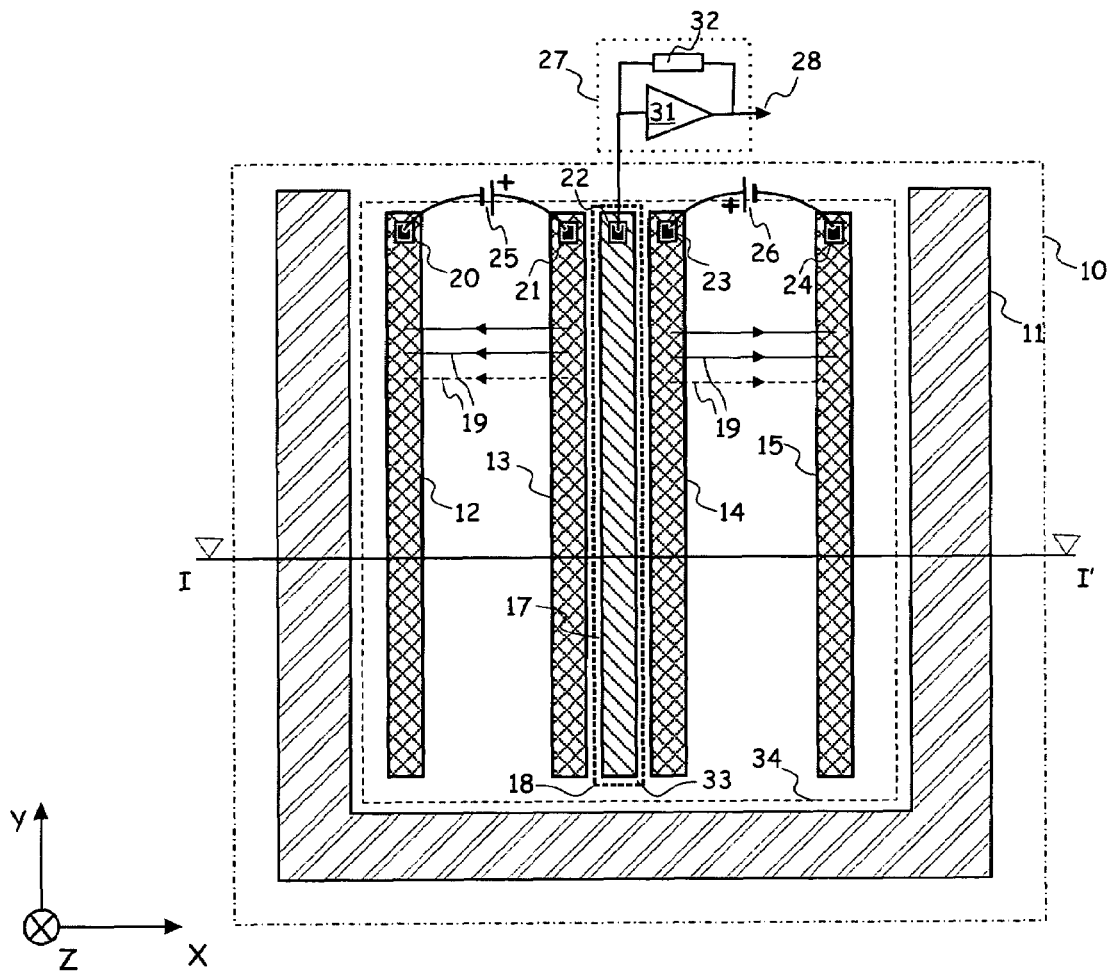
FIG. 1A shows a top view of a photo-detector according to a first embodiment of the present invention.

In the different figures, the same reference figures refer to the same or analogous elements.

DETAILED DESCRIPTION OF THE INVENTION

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

It is to be noticed that the term "comprising", used in the claims, should not be interpreted as being restricted to the means listed thereafter. Thus, the scope of the expression "a device comprising means A and B" should not be limited to devices consisting only of components A and B. It means that with respect to the present invention, the most relevant components of the device are A and B.

Similarly, it is to be noticed that the term "coupled" should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The invention will be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims. It will be clear for a person skilled in the art that the present invention is also applicable to similar devices that can be configured in any transistor technology, including for example, but not limited thereto, CMOS, BICMOS, Bipolar and SiGe BICMOS technology.

Furthermore the findings of the present invention are explained with reference to a p$^-$-substrate as an example, but the present invention includes within its scope a complementary device whereby p and n-regions become n and p-regions, respectively. A skilled person can make such modifications without departing from the true spirit of the invention.

Figure 1B:
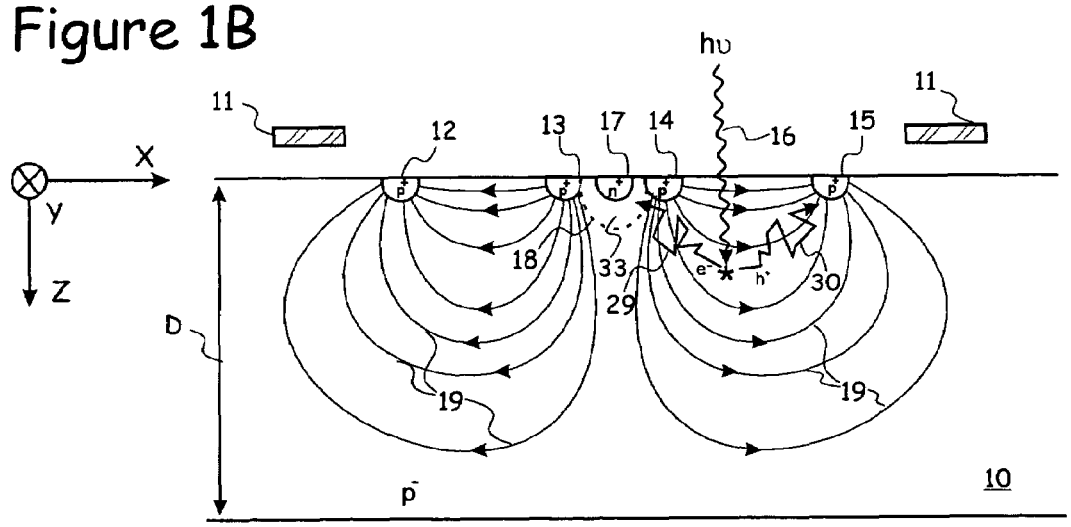
FIG. 1B shows a cross-section along line I–I' of the detector illustrated in FIG. 1A.

FIG. 1A shows a top view of a first embodiment of a photo-detector according to the present invention. Sources 25 and 26 inject current at contacts 21 and 23 respectively, and drain current at contacts 20 and 24 respectively. Contacts 20, 21, 23 and 24 connect through ohmic-conduction to highly doped regions having a first conductivity type, e.g. $p^+$-regions 12, 13, 14 and 15 respectively. In a resistive, lightly doped substrate having the first conductivity type, e.g. $p^-$ substrate 10, a majority carrier current, in the case of a substrate being a $p^-$ substrate, a hole current 19 will flow from region 13 to region 12, and from region 14 to region 15. Line I–I' in FIG. 1A shows where the cross-section is made for FIG. 1B. In FIG. 1B, the majority hole current 19 is shown by solid lines whereby the direction of the hole current 19 is indicated by arrows. In the substrate 10, where the doping is typically considered to be constant, the majority current 19 is associated with an electrical field, in the direction of the current. If incident electromagnetic radiation such as light in the form of a photon 16 is incident within a sensitive area 34 of the detector, the energy associated with the photon 16 is absorbed by the substrate 10, and a reaction takes place that generates an electron hole pair, at a certain position. In the example illustrated in FIG. 1B, the photon 16 falls into the right part of the sensitive area 34. In FIG. 1B, as an example, the electron hole pair generation is considered to occur at the location indicated with a star: "*". The electron-hole pair $e^-/h^+$ will be separated by the electrical field that is present and which is associated to the flowing majority hole current 19. The majority carrier of the electron-hole pair $e^-/h^+$, in the present example the hole $h^+$, will become indistinguishable from the sea of majority carriers, holes in this example, of the flowing majority hole current 19, and will follow for example trajectory 30. The minority carrier of the electron-hole pair, namely in the example given the electron $e^-$, on the contrary, will move in the opposite direction (due to its negative charge), driven by the same electrical field associated with the flowing majority current 19 and undergoes collisions with phonons, generating an erratic trajectory, like trajectory 29. This erratic trajectory 29 has however a general component that is opposite to the majority current flow 19 of the holes directing the electron $e^-$ towards the $p^+$-region 14. The general component in the movement is due to drift based on the present electric field associated with the flowing majority current 19, and the erratic behaviour is due to diffusion, based on collisions with phonons. Very close to region 14, a detecting pn-junction 18 is provided. The minority carrier, electron $e^-$, being directed towards region 14, will have a large chance to reach the depletion zone of this junction 18, and to be detected due to its erratic behaviour (or diffusivity).

It will then form part of the photocurrent that is brought out of the detector through the highly conductive region (i.e. highly doped region) having a second conductivity type, e.g. $n^+$-region 17, through contact 22, connected to readout circuit 27. Readout circuit 27 is typically a transimpedance amplifier, and will typically be integrated on the same substrate 10 as the detector, thus avoiding packaging parasitics. In order to keep the junction capacitance per unit area low, the detecting pn-junction 18 is preferably located between a lowly doped well of the second conductivity type, n-well 33, and the substrate of the first conductivity type, $p^-$-substrate 10. Inside the n-well 33, preferably, an $n^+$-region 17 is added for making the detector finger formed by $n^+$-region 17 and n-well 33 more conductive. As the junction capacitance per unit area is kept low, circuits attached to the photo-detector and optimised for this photo-detector with lower capacitance can reach a considerable better signal to noise output ratio and/or improved speed characteristics.

The n-well 33 should be located close to the hole current sources 13 and 14 in order to increase the chance and the speed with which the electrons will diffuse into the n-well 33 through the detecting pn-junction 18, and thus to increase the sensitivity of the detector. Ohmic contacts in general serve as effective recombination centres for minority carriers, so ohmic contacts are preferably only present very locally, e.g. in a corner of $p^+$-regions 13 and 14, like ohmic contacts 21 and 23 as illustrated in FIG. 1A. If such ohmic contact would be present over a substantial part of these $p^+$-regions 13 and 14, the minority carriers, electrons in the example given, would likely be recombining at these extended ohmic contacts, instead of diffusing towards the detecting pn-junction 18.

In short, incident photons like photon 16 get absorbed in the substrate 10. The electrical field associated with the flowing majority current 19 will cause the photo-generated minority carriers (being electrons in the example given) to drift in the opposite direction to the flowing majority current 19, i.e. towards the source regions 14 and 13 of this majority current 19. By diffusion, finally the electrons arrive in the $n^+$-region 17 and form the detector current going to the readout circuit 27. Beside photons like the example photon 16, a small fraction of the incident photons will be directly absorbed in the detecting finger 17 (region of n-well 33), not requiring the electric field associated to the majority current 19 for transportation.

In this way, the region sensitive to incident photons becomes as large as region 34 illustrated in FIG. 1A and FIG. 1B, whilst the detecting finger 17 (region of n-well 33) has only a small capacitance due to its limited finger area. This can be an order of magnitude smaller than when the full sensitive area 34 would be covered with a pn-junction. This effect has similar benefits to focusing a wide incident light beam through a lens on a small area photo-detector. Hence one can name the present invention method and setup an "electronic lens" for a photodetector. The large sensitive area 34 together with the small area pn-junction 18 for detection of the minority carriers effectively enhances the reachable signal to noise ratio. Further, having a larger sensitive area 34, the alignment of light input means to the sensitive area will require less precision, lowering fabrication cost or connector precision (in the case of repeatable connections).

The speed with which the electrons reach the detecting finger 17 depends on the magnitude of the electrical field that is associated with the majority hole current 19. A person skilled in the art can use device simulators (like ATLAS from Silvaco or MEDICI from Synopsys) and other calculation means or trial and error to determine which field has to be applied to reach a certain speed. In general, the higher the voltage of sources 25 and 26 are, the higher the speed will be. A voltage of 2V gives for a trajectory distance of 20 $\mu$m, a delay of about 5 ns for movement of minority electrons in a silicon substrate 10. With a voltage of 2V and a 40 $\mu$m×40 $\mu$m sensitive detector area, a speed of over 100 MHz can be obtained in standard CMOS. The required majority current 19 depends on the area, the distance between, and the width and length of regions 12, 13, 14 & 15. With typical CMOS-substrates 10 with a resistivity of 20 ohm.cm, and the aforementioned area and voltage, an assistant current of about 400 $\mu$A would flow with a 2 volt applied voltage at the sources 25 and 26. With high resistive substrates 10 this assistant current can become very small. High resistive silicon substrates having a resistivity of 1000 ohm.cm are nowadays not uncommon, lowering the current down to even 8 µA, at roughly the same speed (since the electrical field distribution would remain more or less the same).

Further, when the majority current sourcing finger 13 and the majority current sinking finger 12 are spaced apart by over 20 µm, this being the distance in the X-direction as shown in FIG. 1A, the depth at which carriers still experience a reasonable field due to the majority current 19 is at about a 20 µm deep level D (in the Z direction—see FIG. 1B) from the top of the substrate 10. This increases the overall quantum efficiency of the detector, especially in cases where light is penetrating deeply in the substrate, like with light having a wavelength of 860 nm. In that case, electron-hole pair generation also occurs a depth of 20 microns. Standard CMOS technology typically only offers shallow junctions up to 2 microns deep. Light absorbed at 20 microns is difficult to capture for the junctions, since the generated minority carriers first have to diffuse to this shallow junction before getting detected and becoming part of a photo-current through the terminals of the detector.

In accordance with an aspect of the present invention the readout circuit 27 may comprise a transimpedance amplifier. A transimpedance amplifier typically comprises an opamp 31 and a feedback resistor 32. It is used to convert an input current to an output voltage. For a given bandwidth, the transimpedance amplifier 31, 32 can be designed to have about a 10 times higher transimpedance gain, when supposing that a ten times lower detector capacitance becomes feasible. In this way, the overall sensitivity (i.e. the output voltage change at output node 28 of readout circuit 27 per unit incident light) increases up to a factor of 10. The signal to noise ratio improves as well, by a factor of 3 to 10, depending on whether the noise is mainly due to the noise of the input transistors in the transimpedance amplifier's amplifier 31 or due to the transimpedance amplifier's feedback resistor 32.

Electromagnetic masking such as metal regions 11 can be used to prevent that the impinging electromagnetic radiation, such as light, penetrates in unwanted areas. Area 11 in FIG. 1A is an example of such an area.

Preferably, care should further be taken, to avoid that the detecting pn-junction 18 does not have forward (or too much forward) bias by the application of the voltage on the adjacent majority current source regions 13 and 14.

Figure 2A:
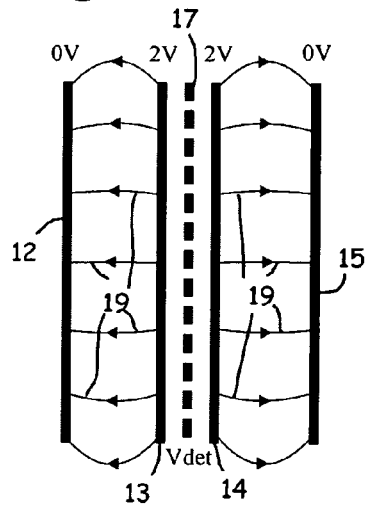
FIG. 2A shows a simplified diagrammatic sketch of the top-view of the photo-detector of FIG. 1A.

FIGS. 2A to 2E show several embodiments of devices according to the present invention. FIG. 2A shows a simplified diagrammatic top-view representation of the detector represented in FIG. 1A, whereby only the necessary subset of elements is represented. The thick solid lines represent the regions of the first conductivity type, p$^+$-regions 12, 13, 14, 15, for applying the majority current. The thick dashed line represents the detector finger 17 in n-well region 33. The voltages applied by sources 25, 26 are also indicated. The voltage on the detector finger 17 is "Vdet". This voltage depends on how the transimpedance amplifier 31 is biased. Typically, this voltage is halfway the power supply voltage. For a power supply voltage of 5V, Vdet is thus typically 2.5V.

Figure 2B:
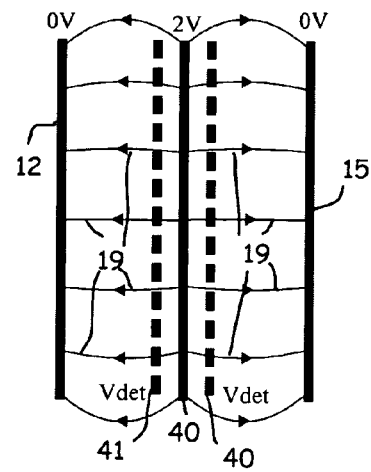
FIGS. 2B, 2C, 2D and 2E show alternative embodiments, namely second to fifth embodiments, of the present invention using the simplified representation principle as in FIG. 2A.

FIG. 2B shows a second embodiment of a detector according to the present invention. It comprises only one source region 40 for injection of the majority current 19, with at each side of it a detector finger 41, 42. In the embodiment shown, the source region 40 is located in the middle of the device. The detector fingers 41, 42 should be connected in parallel. This set-up enhances the speed of the diffusion part of the detecting process, but it also doubles the detector capacitance, since the number of detector fingers 41, 42 is doubled.

Figure 2C:
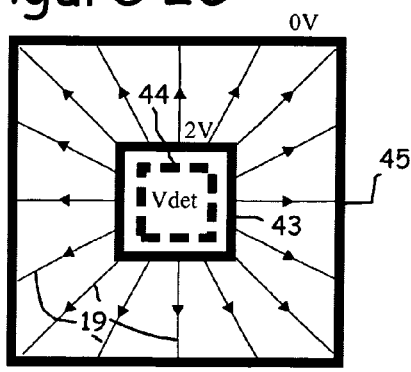
Figure 2D:
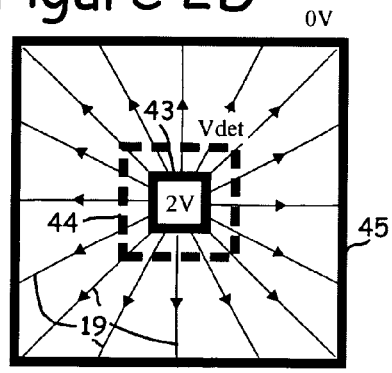

FIGS. 2C and 2D illustrate detectors of a rectangular type.

Especially the embodiment of FIG. 2C is considered a preferred arrangement or best mode example, since in this embodiment the detector capacitance becomes extremely low. Instead of using a detector finger 17, which for example has a dimension of 40 µm×3 µm, there is a detecting pn-junction 44 with an area that can be as small as of the order of only 3 µm×3 µm, whilst the sensitive light input area is still 50 µm×50 µm. A current source region 43, which may be annular with a rectangular shape in top view, as illustrated in FIG. 2C, surrounds the detecting pn-junction 44. Current drain regions 45 are spaced apart for the current source region 43. The current drain regions 45 may also form an annular region with a rectangular shape in top view, as illustrated in FIG. 2C. Alternatively, not shown in the drawings, the current drain regions 45 do not need to touch each other, such that separated current drain regions 45 may be provided. In the same way, separated current source regions 43 may be provided around the detecting pn-junction 44.

The detector of the third embodiment illustrated in FIG. 2D has in the centre its current source region 43, surrounded by a detecting pn-junction 44. Here the detector capacitance is somewhat higher, since the area of the detecting pn-junction 44 is somewhat larger, but it remains low. This set-up enhances the speed of the diffusion part of the detecting process, since the current source region 43 is surrounded by the detecting pn-junction 44.

Figure 2E:
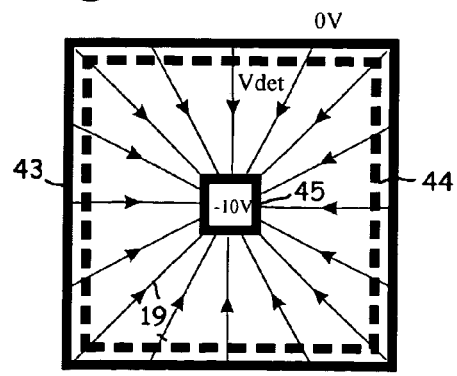

FIG. 2E shows a fifth embodiment of a detector according to the present invention, in which the minority carriers, e.g. electrons, are not driven to the centre, but to the edge of the detector. In the middle, the current drain region 45 can be biased at a low, negative voltage, of e.g. −10V, without hindering the functioning of circuits outside the detector. This is preferred for higher speeds in the GHz range. The outside region(s) of the first conductivity type, e.g. a p$^+$-ring 43 as in FIG. 2E or separated p$^+$-regions, that sources the majority hole current 19 can be biased at a voltage higher than the negative voltage of the current drain region 45, at a high voltage, e.g. at 0V or 2V. With these stronger applied majority currents 19 and hence stronger electrical fields, up to GHz speeds can be obtained, still with a reasonably small detector capacitance.

The structure of the device illustrated in FIG. 3 makes use of the same principles as the detector of FIG. 1, however, it has another function. One of the uses is in "time of flight" (TOF) range-finding applications. Prior art documents WO 98/10255 and WO 99/60629 explain the general principle of time of flight measurements for range finding applications. A light source is modulated at a frequency in the range of 1 MHz to 1 GHz. The light illuminates an object, or scene, and part of the reflected light enters the range finder camera through a focused lens. By measuring in each pixel the phase of the incident light, a distance can be estimated between the pixel and its conjugate (light-reflecting) pixel-area in the scene. In this way the distances of objects and the shape of objects can be estimated and recorded.

Technical problem in the known type of TOF range finders is to find a way to measure the phase of the reflected light accurately. The phase accuracy is linked to the precision of estimating the distance. The better the signal to noise ratio, the less noise, and thus error, there is on the estimated distance. For that purpose, it can be calculated that low noise can be achieved by mixing the incident light right away in the detector, instead of in a connected electronic mixer. An electronic mixer is an inherent source of noise, due to the transistors that have to operate at high frequency and at high bias currents and should hence be avoided.

Figure 3A:
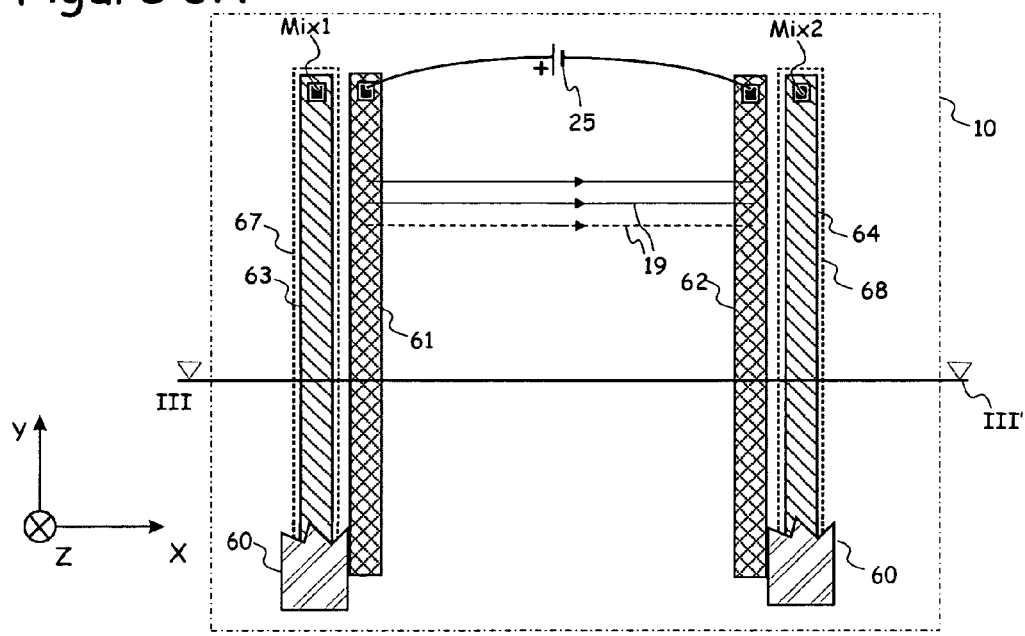
FIG. 3A shows a top view of an embodiment of a photonic mixer structure whereby an applied majority current determines that photo-generated electrons are directed towards a detecting pn-junction.
Figure 3B:
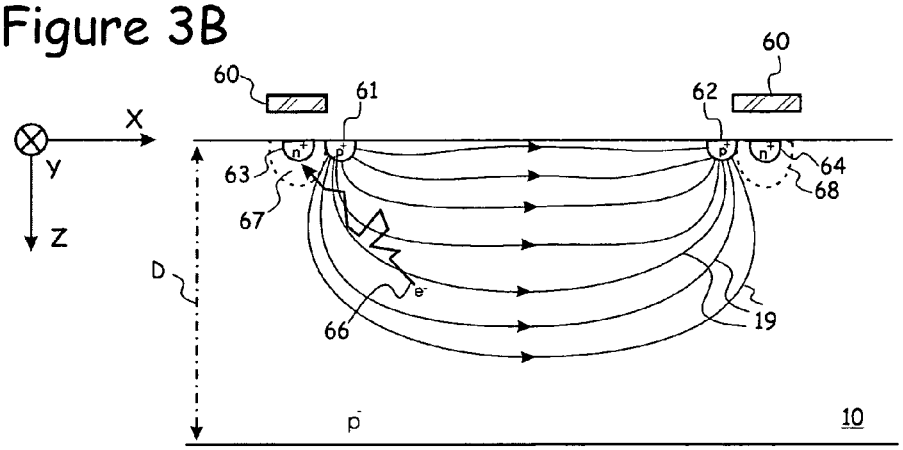
FIG. 3B shows a cross-section of the photonic mixer structure of FIG. 3A in the same current condition.

FIG. 3A illustrates a photonic mixer according to an embodiment of the present invention, that mixes incident amplitude modulated electromagnetic radiation with an electrical signal applied to the substrate 10 through source 25, and outputs two electrical photo-currents at output nodes Mix1 and Mix2. FIG. 3B shows a cross-section through line III–III' of the device illustrated in FIG. 3A. The electrical signal applied by source 25, generates a majority current, e.g. majority hole current 19, through the substrate 10. Minority carriers, like electrons in a p-substrate 10, will feel the electrical field that is associated with the applied majority hole current 19, and will drift towards a first source of majority carriers, e.g. holes, which is in the example illustrated $p^+$-region 61. They will then diffuse into an adjacent first detection region, n-well 67, and they will become part of the output photocurrent of the left mixer connection point Mix1. A possible electron trajectory is trajectory 66, as illustrated in FIG. 3B.

Figure 3C:
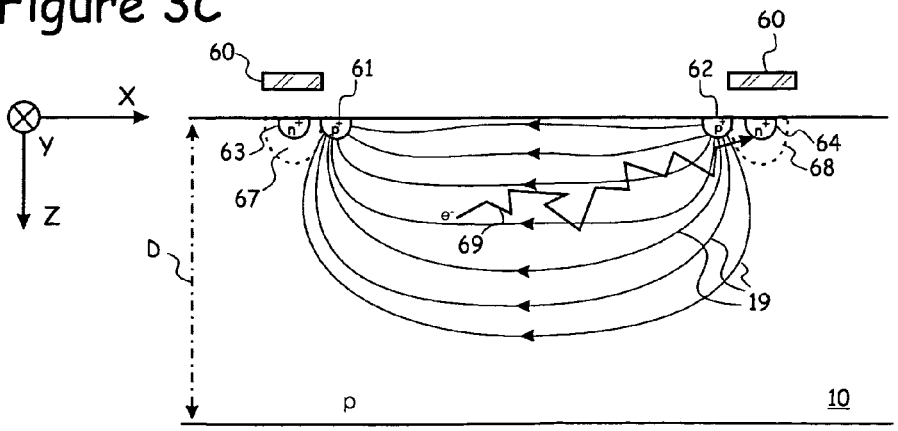
FIG. 3C shows a cross-section of the photonic mixer structure of FIG. 3A, whereby the majority current is inverted, thereby determining that photo-generated minority carriers get directed towards another detecting pn-junction.

When the applied voltage or electrical signal is inverted as illustrated in FIG. 3C, the direction of the majority current flow is inverted, and the minority carriers drift towards the complementary source region, $p^+$-finger 62. Thereafter, most of the minority carriers, namely electrons, diffuse into the second detection region, n-well 68, becoming part of the output photocurrent of the right mixer connection point MIX2. A possible electron trajectory is trajectory 69, as shown in FIG. 3C.

Electromagnetic masking such as metal areas 60, can be used to block unwanted light which otherwise would be directly incident on the detecting regions 67, 68.

This photonic mixer has a high efficiency. First of all, the electrical field associated with the majority current 19, that cause the drift of the minority carriers, namely electrons, in the specified direction can penetrate deep in the substrate 10. How deep depends largely on the distance in X direction, i.e. parallel with the surface of the substrate 10, between $p^+$-regions 61 and 62, as with the aforementioned detector of the present invention. The larger the pixel, i.e. the larger the distance between the $p^+$-regions 61 and 62, the deeper the majority current 19 and hence the deeper the associated electrical fields penetrate. A distance of 20 $\mu$m between regions 61 and 62 will accommodate light that penetrates about 20 $\mu$m deep. This is useful for infrared light with a wavelength of 860 nm in Silicon. A switching speed and delay of electron transit in the order of nanoseconds is sufficient for many range-finding applications. When the majority current 19 penetrates deep enough for a given wavelength, it can also be expected that the quantum efficiency and the discrimination efficiency are near to optimal.

Figure 4A:
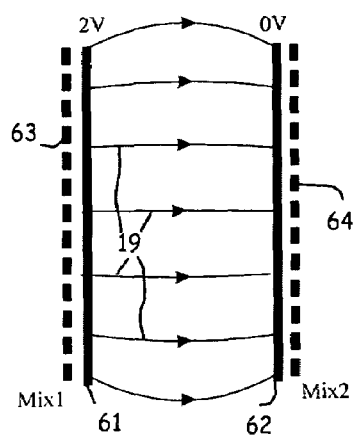
FIGS. 4A and 4B show simplified sketches of the top-view of the photonic mixer structure of FIG. 3A, with the majority current conditions of FIG. 3A and FIG. 3C respectively.
Figure 4B:
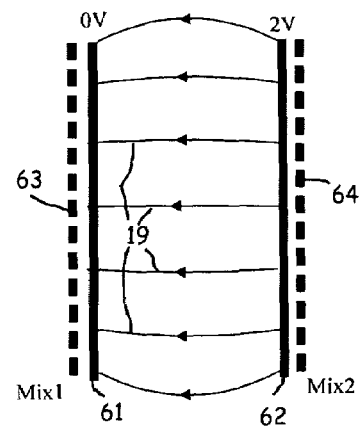

FIGS. 4A and 4B are simplified, schematic representations of the photonic mixer illustrated in FIG. A, for the two majority current conditions of FIGS. 3B and 3C. The thick solid lines represent the $p^+$-regions 61, 62 for applying the majority current 19. Thick dashed lines represent detector fingers 63, 64 in detection regions 67, 68. An example of applied voltages is also indicated.

Figure 4C:
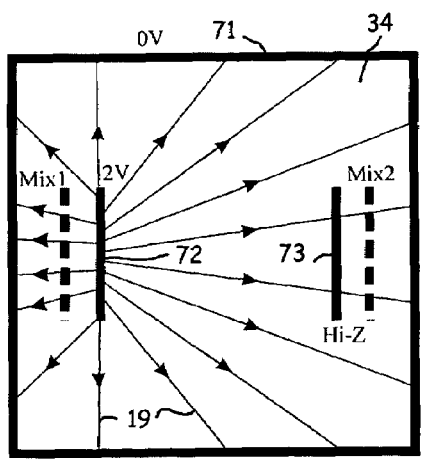
FIGS. 4C and 4D show an alternative embodiment of a photonic mixer structure, using the simplified representation as in FIGS. 4A and 4B.
Figure 4D:
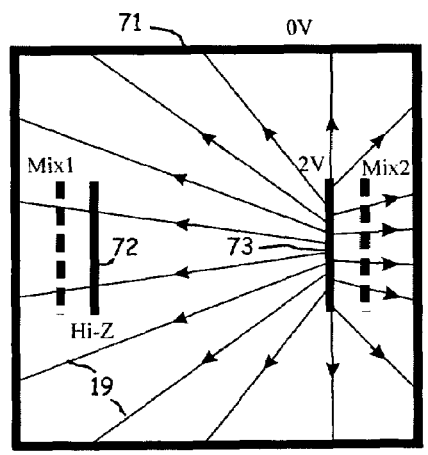

FIGS. 4C and 4D represent a second embodiment of a photonic mixer according to the present invention, under two different majority current conditions. This mixer has further a current drain region, e.g. formed by a $p^+$-ring or a plurality of separated $p^+$-regions (not represented in the drawings), that surrounds the sensitive area 34, and that is always connected to a low voltage, e.g. GND (0V). Further there are two short fingers 72, 73 of the first conductivity type, e.g. $p^+$-fingers, that are either connected to a high voltage, e.g. 2V, or disconnected (floating). In FIG. 4C, the left short finger 72 is connected to the high voltage, e.g. 2V, and it sources current into the substrate 10, generating current lines of a majority current 19 to said outer $p^+$-ring 71 connected to the low voltage, e.g. ground. Minority carriers, e.g. electrons, are driven by the field associated to these current lines 19 towards the short finger 72 at the high voltage, e.g. 2V. Then they are diffused to a first detection finger Mix1. The other short $p^+$-finger 73 is left floating (High Impedance=Hi–Z). When the high voltage is applied to the short $p^+$-finger 73 at the right, and the short $p^+$-finger 72 at the left is left floating, the minority carriers, electrons, get targeted to the detection finger Mix2 at the right.

For doing the phase estimation one would typically apply an electrical oscillating signal source 25 to the photonic mixer that is in phase, and thereafter (or in a second photonic mixer), one that is 90° delayed in phase with respect to the phase of the oscillating light source. For measuring the mixing products one would typically first reset the terminals Mix1 and Mix2 to a high voltage e.g. 5 Volt, and then apply the oscillating source 25 to the mixer, and after a measuring accumulation period, stop this oscillation for measuring what the integrated voltage drops on Mix1 and Mix2 have become. These voltage drops are then a result of the accumulation of the photo-current on nodes Mix1 and Mix2. The common mode voltage drop will then give an indication of the DC incident component of the light, whilst the difference in voltage between Mix1 and Mix2 gives the part of the mixing product that is used for measuring the effective phase and/or distance. WO 98/10255 and WO 99/60629 are incorporated herein by reference and can be consulted to explain the concepts of TOF, phase and amplitude measurements in further detail for range finding applications.

Further, for some measurement set-ups it can be useful to design a photonic mixer that has more than two mixer output terminals. The number of configurable current conditions has then to be adapted to the number of mixer output terminals. Person skilled in the art can easily extend the findings of this patent to this purpose.

Figure 4E:
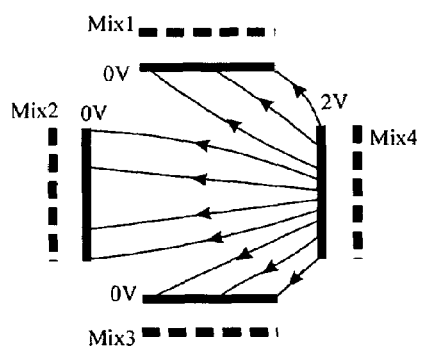
FIG. 4E shows still another embodiment of a photonic mixer structure having four majority current conditions that can be applied, whereby for each condition the electrons are directed towards a separate mixer output connection. Only one current condition and biasing level are shown.

FIG. 4E shows such a photonic mixer, having four current situations and four mixer outputs. More precise phase detection can be expected with this structure, since, 0, 90, 180 and 270 degrees mixing can be achieved during a same measuring accumulation period and on the same sensitive detector area. For this to work well, subsequently, it is preferred if each $p^+$-region is used as current inlet, e.g. by biasing it at a high voltage of e.g. 2V, whilst the other 3 $p^+$-regions are kept at a low voltage of e.g. 0V. In that way, the direction of the majority current 19 in the middle of the mixer can be made to rotate in order to fulfil its mixing purpose.

Furthermore, a person skilled in the art can also design other useful current configurations different from the one in FIG. 4E, without departing from the scope of the present invention. For example, a current condition in which two or more $p^+$-regions are simultaneously used as current inlet may be considered.

When a large photo-detector or photonic mixer would be required for some application, the person skilled in the art can consider placing two or more detectors or photonic mixers according to embodiments of the present invention in parallel, in that way increasing the sensitive area to up to what is required.

It is to be understood that although preferred embodiments, specific constructions and configurations, as well as materials, have been discussed herein for devices according to the present invention, various changes or modifications in form and detail may be made without departing from the scope and spirit of this invention.

Figure 5:
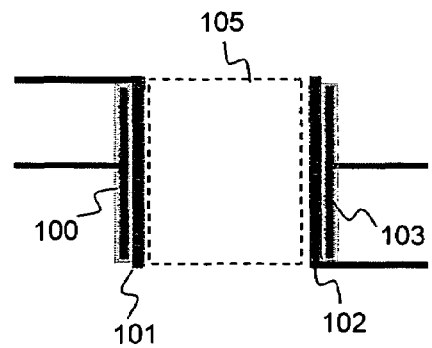
FIG. 5 illustrates the layout of a prototype of a photo-detector according to an embodiment of the present invention.

A prototype of a photo-detector according to an embodiment of the present invention has been developed in AMS 0.6 μm p-substrate technology. The layout of the pixel is shown in FIG. 5 and comprises p+ regions 101 and 102 for applying the majority current and n+ doped detection regions or detector fingers 100 and 103. The region sensitive to incident light is defined by 105 and in the prototype measures 31 μm×29 μm.

In the test setup a 10.5 μW laser light bundle with a wavelength of 850 nm has been focused on the center 105 of the pixel. Varying voltage differences V(101)–V(102) have been applied between p+ regions 101 and 102 for applying the majority current. At detector fingers 100 and 103 2V was applied. The photocurrents at detection fingers 100 and 103 where measured. Measurement data is presented in table 1 hereunder.

TABLE 1

| V (101)–V (102) (mv) | I (100) (μA) | I (103) (μA) | Demodulation contrast (%) | Responsivity (A/W) |
|---|---|---|---|---|
| 0 | 1.1 | 1.1 | 0.00 | 0.21 |
| 100 | 1.7 | 0.8 | 36.00 | 0.24 |
| 200 | 2.2 | 0.5 | 62.96 | 0.26 |
| 300 | 2.6 | 0.2 | 85.71 | 0.27 |
| 400 | 2.8 | 0 | 100.00 | 0.27 |
| 500 | 2.9 | 0 | 100.00 | 0.28 |
| 600 | 3 | 0 | 100.00 | 0.29 |
| 700 | 3.1 | 0 | 100.00 | 0.30 |
| 800 | 3.1 | 0 | 100.00 | 0.30 |
| 900 | 3.1 | 0 | 100.00 | 0.30 |

Figure 6:
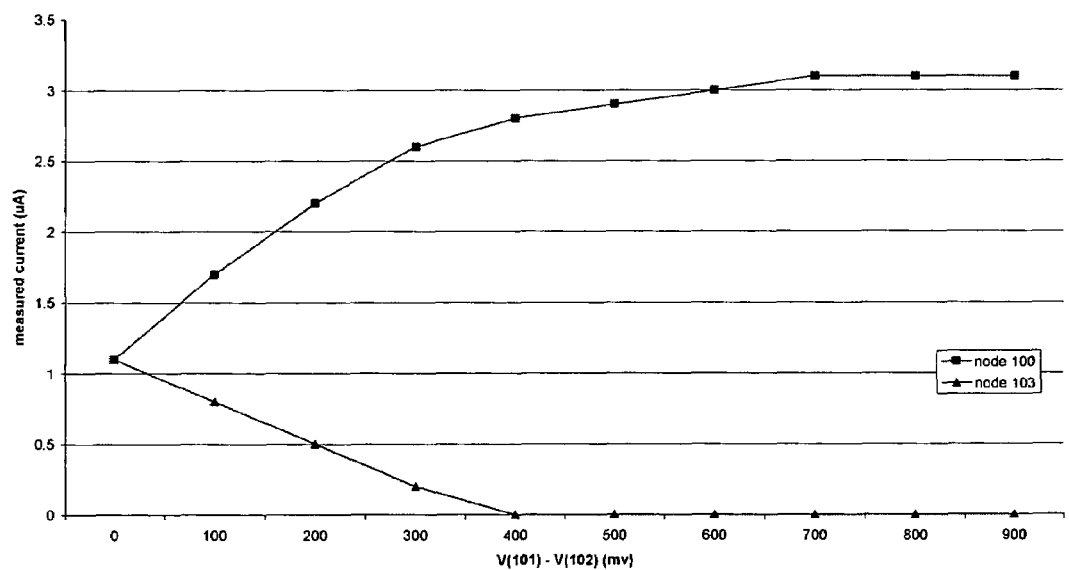
FIG. 6 is a graph illustrating the current measured at the detector fingers of the photo-detector of FIG. 5 in function of the voltage difference applied between the p+ regions.

FIG. 6 shows the detected currents at detector fingers 100 and 103 versus the applied voltage difference between p+ regions 101 and 102. It can be seen that, with no voltage difference between p+ regions 101 and 102, the same amount of current goes to detector fingers 100 and 103. The higher the voltage difference, the more current flows towards detector finger 100, and the less current flows to detector finger 103, up to a situation at a voltage difference of 400 mV between both p+ regions 101 and 102 whereby all current flows to detector finger 100.

Figure 7:
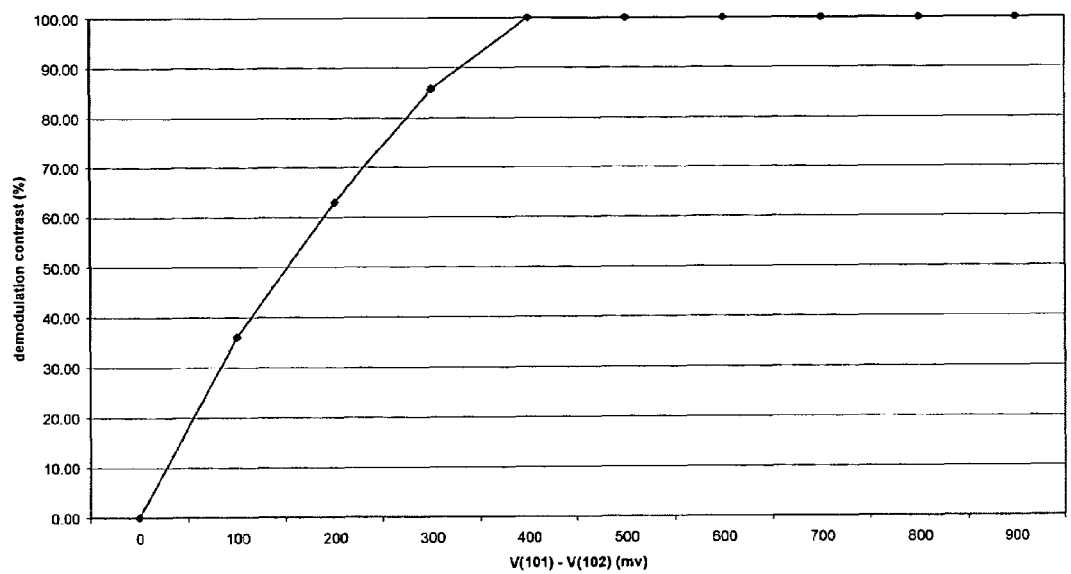
FIG. 7 is a graph illustrating the demodulation contrast in function of the voltage difference applied between the p+ regions.

FIG. 7 shows the resulting demodulation contrast, a common used measure, which is defined by:

$$\text{Demodulation contrast} = \frac{I(100) - I(103)}{I(100) + I(103)}$$

When no voltage difference is applied between the p+ regions 101, 102 the photo-generated electrons arrive equally at the detection regions 100, 103 both sides. At low voltage differences between both p+ regions 101, 102 more photo-generated electrons arrive at detector finger 100 and less at detector finger 103. At a voltage difference of 400 mV, a demodulation contrast of 100% is achieved. When applying still larger voltages the electrical field extends deeper in the substrate so that more electrons e⁻ reach detection finger 100 resulting in a higher responsivity and quantum efficiency.

What is claimed is:

1. A detector device for detection of electromagnetic radiation impinging on a substrate (10), the impinging electromagnetic radiation generating pairs of majority ($h^+$) and minority carriers ($e^-$) in the substrate (10), the detector device comprising means (25, 26) for generating, in the substrate (10), a majority carrier current (19), and at least one detection region (17) for collecting generated minority carriers ($e^-$), the minority carriers ($e^-$) being directed towards the at least one detection region (17) under influence of the majority carrier current (19).

2. A detector device according to claim 1, furthermore comprising at least one current source region (13, 14) and at least one current drain region (12, 15), the means for generating the majority carrier current (19) being adapted for generating this majority carrier current between the at least one current source region (13, 14) and the at least one current drain region (12, 15).

3. A detector device according to claim 2, wherein the at least one current source region (13, 14) is located between the at least one current drain region (12, 15) and the at least one detection region (17).

4. A detector device according to claim 2, wherein the at least one detection region (41, 42) is located between the at least one current source region (40) and the at least one current drain region (12, 15).

5. A detector device according to claim 2, wherein the current source region (43) has an annular shape in the plane of the substrate (10).

6. A detector device according to claim 2, wherein the current drain region (45) has an annular shape in the plane of the substrate (10).

7. A detector device according to claim 1, furthermore comprising readout means (27) for reading out the minority carriers ($e^-$) collected in the detection region (17).

8. A detector device according to claim 7, wherein the readout means (27) comprises a transimpedance amplifier (31).

9. A detector device according to claim 2, whereby minority carriers ($e^-$) having reached the at least one current source region (13,14) travel towards the at least one detection region (17) by diffusion.

10. A detector device according to claim 1, whereby the sensitive area (34) is substantially larger than the area of the at least one detection region (17).

11. A detector device according to claim 1, wherein the detector device is a photonic mixer.

12. A detector device according to claim 11, wherein the means (25, 26) for generating the majority carrier current is reconfigurable, so as to be able to generate the majority carrier current (19) in either at least a first direction or a second direction different from the first direction.

13. A detector device according to claim 12, wherein the second direction is opposite to the first direction.

14. A detector device according to claim 2, wherein the current source region (13, 14), the current drain region (12, 15) and the detection region (17) are located substantially in the same plane.

15. A method for detection of electromagnetic radiation impinging on a substrate (10), the impinging electromagnetic radiation generating pairs of majority ($h^+$) and minority carriers ($e^-$) in the substrate (10), the method comprising generating a majority carrier current (19) in the substrate (10), and directing generated minority carriers towards a detection region (17) under influence of the generated majority carrier current (19).

16. A method according to claim 15, furthermore comprising collecting the minority carriers (e⁻) in the detection region (17).

17. A method according to claim 16, furthermore comprising reading out the minority carriers (e⁻) collected in the detection region (17).

18. A method according to claim 15, furthermore comprising: generating the majority carrier current (19) so as to at least first generate the majority carrier current (19) in a first direction and to direct generated minority carriers towards a first detection region, and thereafter generate the majority carrier current (19) in a second direction, the second direction being different with respect to the first direction, to thereby direct generated minority carriers towards a second detection region.

* * * * *